(12) United States Patent
Krivokapic

(10) Patent No.: US 6,566,680 B1
(45) Date of Patent: May 20, 2003

(54) SEMICONDUCTOR-ON-INSULATOR (SOI) TUNNELING JUNCTION TRANSISTOR

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 5 days.

(21) Appl. No.: 09/772,610

(22) Filed: Jan. 30, 2001

(51) Int. Cl.[7] .................. H01L 21/84; H01L 29/06; H01L 27/01
(52) U.S. Cl. .................. 257/30; 257/347; 257/349; 438/151
(58) Field of Search .................. 438/151–166; 257/9, 30, 347, 349

(56) References Cited

U.S. PATENT DOCUMENTS

| | | | |
|---|---|---|---|
| 5,185,280 A | * 2/1993 | Houston et al. | 257/327 |
| 5,989,963 A | * 11/1999 | Luning et al. | 257/29.055 |
| 6,004,836 A | * 12/1999 | Chang et al. | 438/151 |
| 6,037,605 A | * 3/2000 | Yoshimura | 257/25 |
| 6,091,076 A | * 7/2000 | Deleonibus | 257/24 |
| 6,184,112 B1 | * 2/2001 | Maszara et al. | 438/162 |
| 6,198,113 B1 | * 3/2001 | Grupp | 257/30 |
| 6,294,412 B1 | * 9/2001 | Krivokapic | 438/155 |
| 6,300,664 B1 | * 10/2001 | Kuroi et al. | 257/316 |

OTHER PUBLICATIONS

Wolf et al., "Silicon Processing for the VLSI Era vol. 1: Process Technology", pp. 151–155, 1986; Lattice Press.*
Moslehi, Mehrdad M. and Saraswat, Krishna C. "Thermal Nitridation of Si and $SiO_2$ VLSI". IEEE Transactions on Electron Devices, vol. ED–32, No. 2, Feb. 1985. pp. 106–123.

* cited by examiner

*Primary Examiner*—Richard Booth
(74) *Attorney, Agent, or Firm*—Renner, Otto, Boisselle & Sklar, LLP

(57) ABSTRACT

A tunneling junction transistor (TJT) device formed on a semiconductor-on-insulator (SOI) substrate with a buried oxide (BOX) layer disposed thereon and an active layer disposed on the BOX layer having active regions defined by isolation trenches. The TJT device includes a gate defining a channel interposed between a source and a drain formed within one of the active regions of the SOI substrate. At least one thin nitride layer is interposed between a portion of the channel and at least one of the source and the drain.

16 Claims, 15 Drawing Sheets

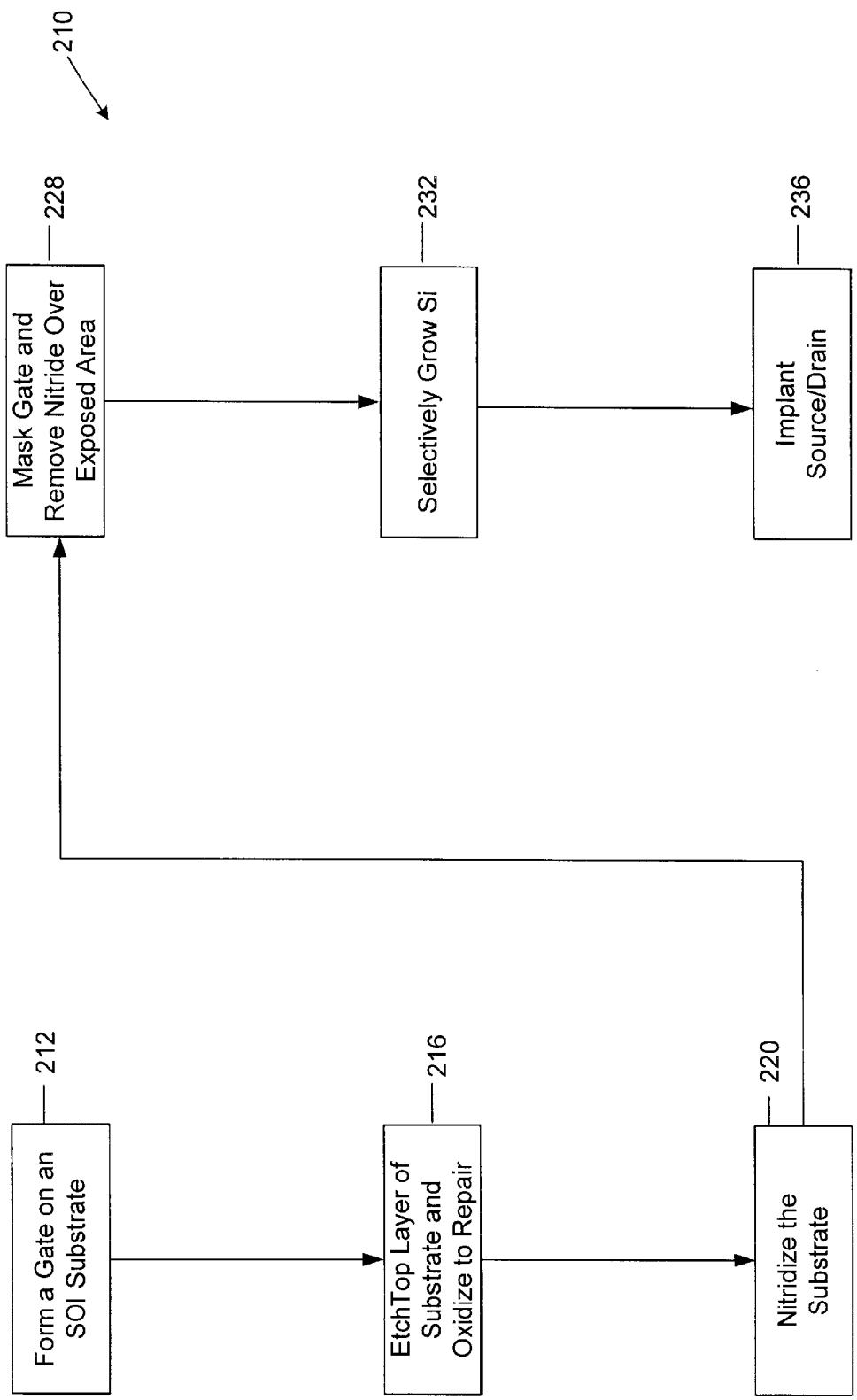

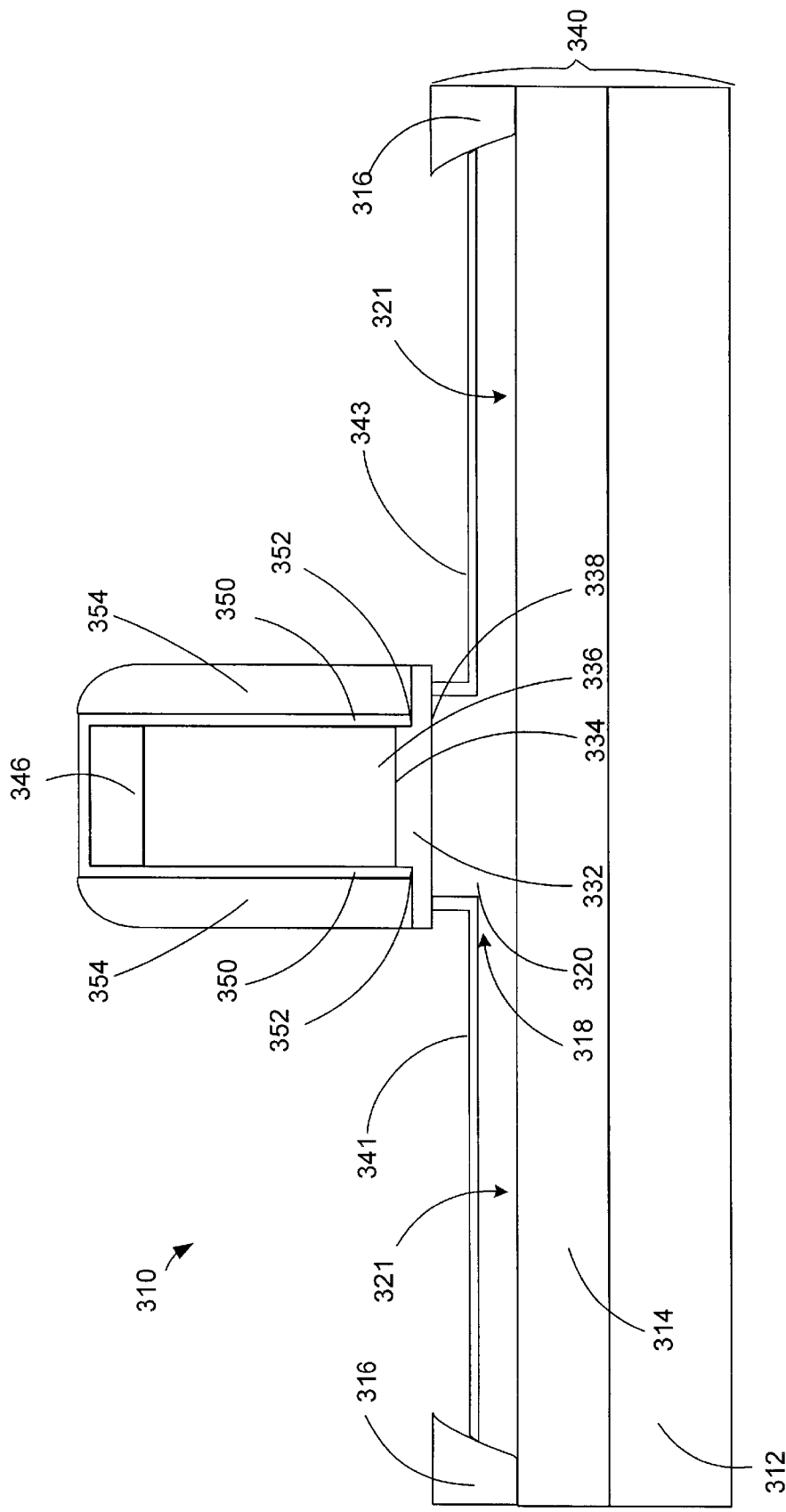

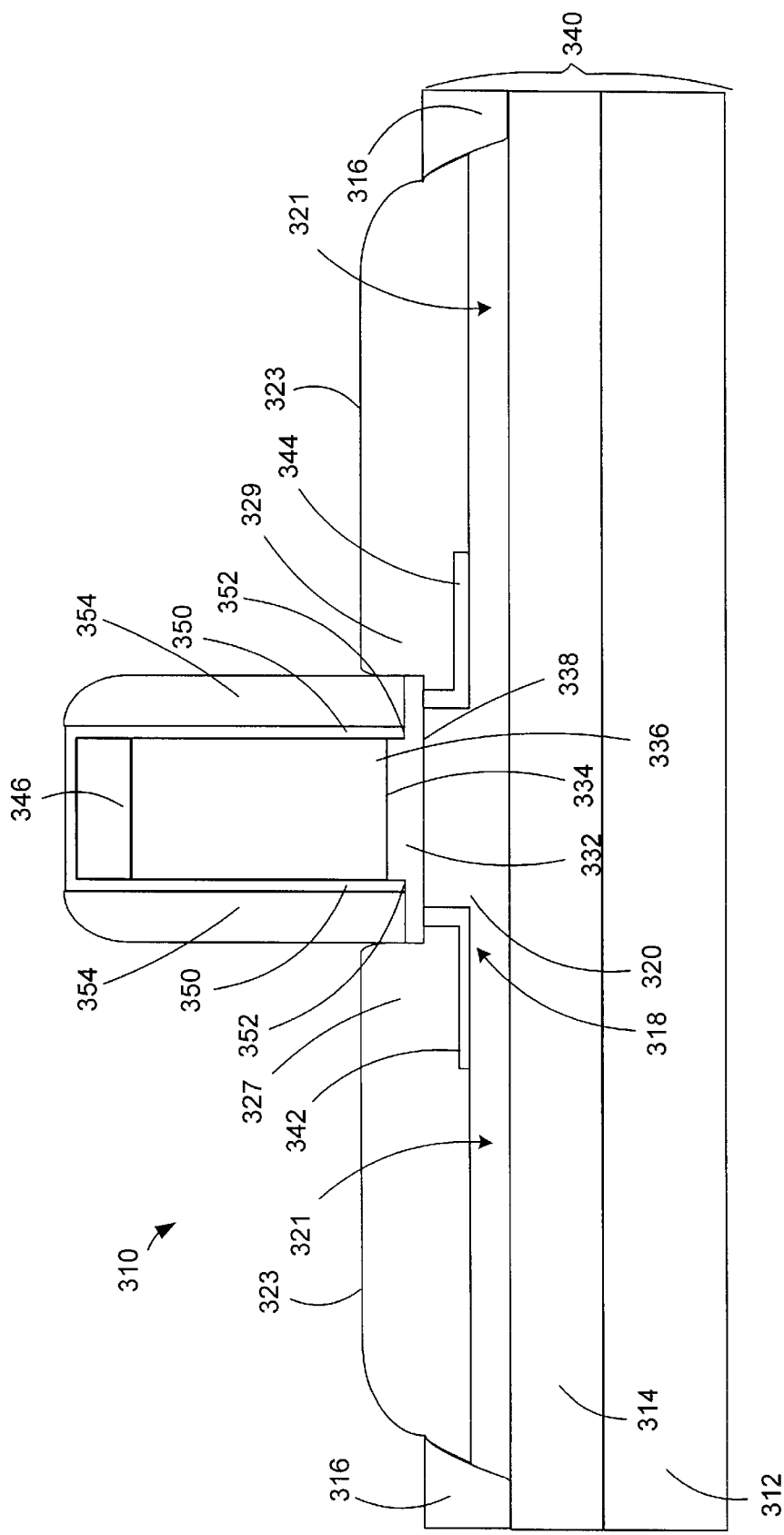

SEMICONDUCTOR-ON-INSULATOR (SOI) TUNNELING JUNCTION TRANSISTOR

TECHNICAL FIELD

The present invention generally relates to the manufacture of semiconductor devices, and, more specifically, relates to the manufacture of semiconductor-on-insulator (SOI) tunneling junction transistor (TJT) devices.

BACKGROUND ART

Traditional semiconductor-on-insulator (SOI) transistor devices typically have a gate defining a channel interposed between a source and a drain formed within an active region of an SOI substrate. During an off-state of such an SOI transistor device electrons from the source are disposed to traversing the channel to the drain. This loss of electrons from the source to the drain is referred to as off-state leakage. Off-state leakage is controlled in such an SOI transistor device by increasing the off-state voltage to the gate electrode thereby reducing the size of the path between the source and drain through which the electrons traverse the channel. However, the increase in voltage to the gate electrode decreases the life span of the device as well as battery life in systems, which use batteries as the power source.

Therefore, there exists a strong need in the art for an SOI transistor device which reduces the off-state leakage, the voltage and the operating cost.

SUMMARY OF THE INVENTION

According to one aspect of the invention, the invention is a tunneling junction transistor (TJT) device formed on a semiconductor-on-insulator (SOI) substrate. The TJT device includes a gate defining a channel interposed between a source and a drain formed within one of the active regions of the SOI substrate. At least one thin nitride layer is interposed between a portion of the channel and at least one of the source and the drain.

According to another aspect of the invention, the invention is a method of fabricating an SOI TJT device. The method includes the step of forming a gate on an SOI substrate. Additionally, the method includes the step of forming a nitride layer on the SOI substrate. The method further includes the step of forming the nitride layer interposed between at least a portion of a channel interposed between a source and a drain within one of the active regions.

According to another aspect of the invention, the invention is a method of fabricating an SOI TJT device as described immediately above. The method includes the additional steps of partially etching a semiconductor layer of the SOI substrate between the gate and the isolation trenches; oxidizing the etched semiconductor layer to repair an upper surface of the etched semiconductor layer and removing a resulting oxide layer. The method further includes the step of nitridizing the exposed upper surface of the etched and oxidized SOI substrate to form a thin nitride layer. Additionally, the method includes steps of forming a mask on the gate and a portion of the thin nitride layer and removing exposed portions of the nitride layer. Further, the method includes the steps of growing a semiconductor material on the exposed upper surface of the SOI substrate and the remaining plurality of resulting thin nitride layers and implanting dopants into the exposed semiconductor material and through a portion of the remaining plurality of resulting thin nitride layers to form a source and a drain.

According to another aspect of the invention, the invention is a method of fabricating an SOI TJT device. The method includes the step of forming a gate on an SOI substrate. The method includes the additional step of oxidizing the semiconductor layer to repair an upper surface of the semiconductor layer and removing a resulting oxide layer when forming the channel interposed between the source and the drain within one of the active regions. The method also includes the step of nitridizing the exposed upper surface of the oxidized SOI substrate to form a thin nitride layer. Further, the method includes the steps of forming a mask on the gate and a portion of the thin nitride layer and removing exposed portions of the nitride layer. Additionally, the method includes the steps of growing a semiconductor material on the exposed upper surface of the SOI substrate and the plurality of resulting thin nitride layers and implanting dopants into the exposed semiconductor material and through a portion the plurality of resulting thin nitride layers to form a source and a drain.

According to another aspect of the invention, the invention is an SOI TJT device. The TJT device includes a gate having at least one tunneling barrier interposed between a channel and at least one of a source and a drain formed within one of the active regions of the SOI substrate.

According to another aspect of the invention, the invention is a TJT device formed on a germanium-on-insulator (GOI) substrate. The GOI TJT device includes a gate having a channel interposed between a source and a drain formed within one of the active regions of the GOI substrate. Interposed between the channel and at least one of the source and the drain is a thin nitride layer.

BRIEF DESCRIPTION OF DRAWINGS

These and further features of the present invention will be apparent with reference to the following description and drawings, wherein:

FIG. 2 is a flow diagram of a method of manufacturing the SOI TJT device according to the present invention;

FIG. 3D is a cross-section of the SOI TJT device according to the present invention in a fourth intermediate stage of manufacture;

FIG. 3F is a cross-section of the SOI TJT device according to the present invention in a sixth intermediate stage of manufacture;

DISCLOSURE OF INVENTION

Figure 1:
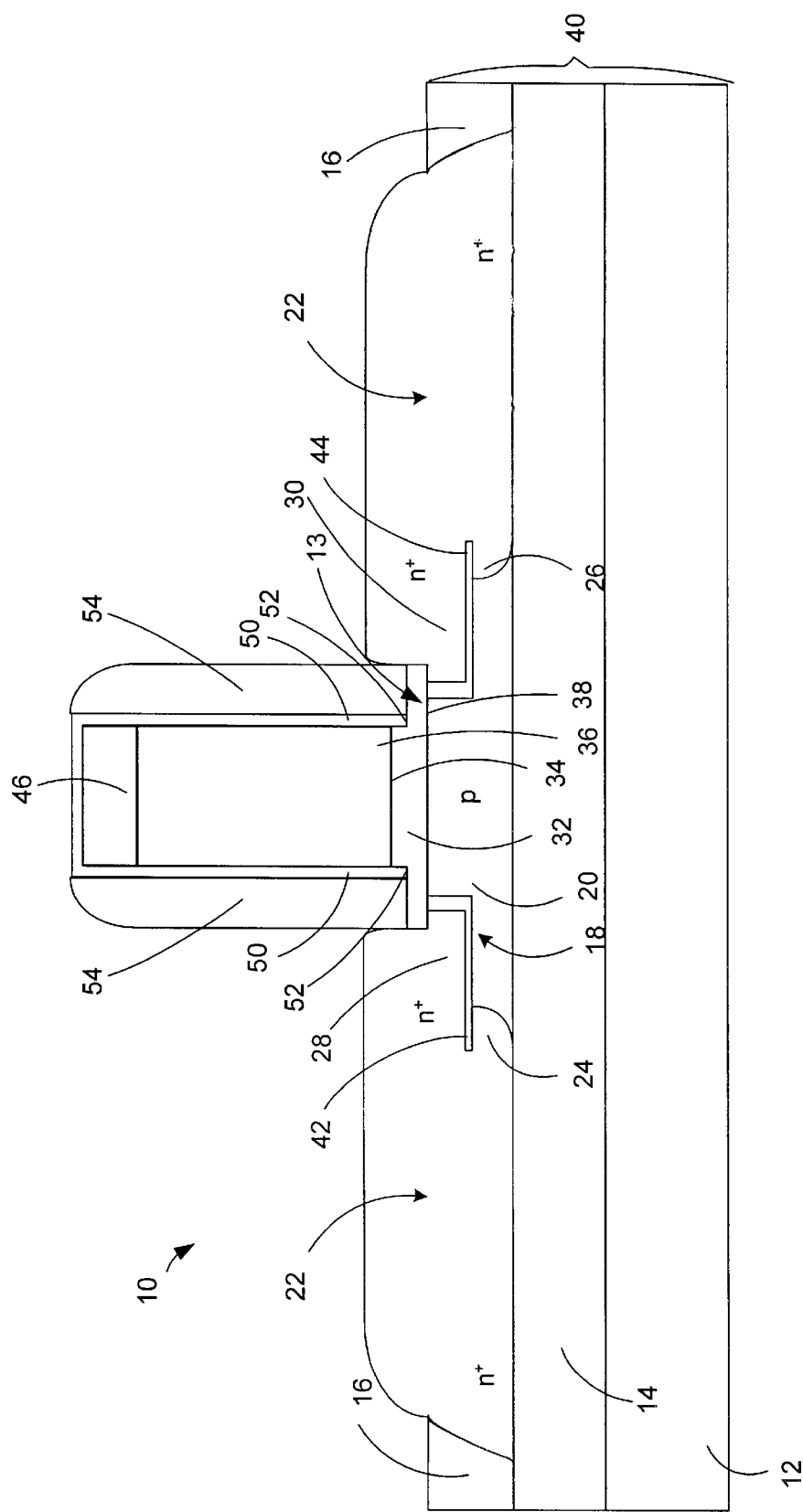
FIG. 1 is a cross-section of an SOI TJT device according to the present invention.

In the detailed description that follows, identical components have been given the same reference numerals. To illustrate the present invention in a clear and concise manner, the drawings may not necessarily be to scale and certain features may be shown in a partial schematic format.

Referring initially to FIG. 1, an SOI TJT device of the present invention is shown generally designated as 10. The SOI TJT device 10 comprises a gate defining a channel 20 having a source and a drain 22 within an active region 18 of an SOI substrate 40. A plurality of thin nitride layers 42, 44 are interposed between a portion of the channel 20 and the source and the drain 22. The source and the drain 22 may include identically deeply doped regions 24, 26 below the plurality of thin nitride layers 42, 44 and lightly doped shallow extensions 28, 30 above. Although, the embodiment shows a plurality of thin nitride layers 42, 44 interposed between a portion of the channel 20 and the source and the drain 22 it should be understood that a single thin nitride layer may be interposed between a portion of the channel 20 and either the source or the drain.

The thin nitride layers 42, 44 form tunneling barriers in which electrons disposed to traversing the channel 20 in an off-state from the source extension 28 must tunnel from the source extension 28 through the nitride layer 42 into the channel 20, traverse the channel 20 and then tunnel through nitride layer 44 into the drain extension 30.

The SOI TJT device 10 with nitride layers 42, 44 forming tunneling barriers significantly reduces the off-state leakage compared with traditional SOI transistor devices or conventional bulk silicon transistor devices. Additionally, the tunneling barriers reduce the amount of voltage directed to the gate to prevent off-state leakage. Further, the reduced voltage requirement increases the lifespan of the SOI TJT device. Further still, the reduced voltage requirement reduces operating costs.

Continuing to refer to FIG. 1, a first embodiment of an SOI TJT device 10 will now be described in more detail. The SOI TJT device 10 is formed using an SOI structure having a semiconductor substrate 12, a buried oxide (BOX) layer 14 formed on the semiconductor substrate 12 and a semiconductor layer 13 disposed on the BOX layer 14. An exemplary BOX layer may have a thickness of between 1800 and 2200 Å. Whereas, an exemplary semiconductor layer 13 disposed on the BOX layer 14 may have a thickness of between 800 and 1000 Å. Suitable semiconductor materials such as silicon, carbide or germanium may be used as the semiconductor layer 13 disposed on the BOX layer 14. Within the semiconductor layer 13 disposed on the BOX layer 14, shallow trench isolation (STI) regions 16 define a semiconductor active region 18. The STI regions 16 are insulator-filled to electrically isolate individual electrical devices such as the SOI TJT device 10. Other isolation techniques that are known in the art may be used to isolate the SOI TJT device 10. In an exemplary embodiment, as illustrated in FIG. 1, the active region 18 has a p-type doped region, or channel 20, and two N+ regions, or a source and a drain 22. The channel 20 is interposed between the two N+ regions 22. Alternatively, a channel could be interposed between two P+ regions. The two N+ regions 22 have respective deep implant regions 24 and 26, as well as respective extension regions 28 and 30. The p-type doped region 20 may be predoped prior to the manufacturing of the gate device with n-type dopants for p-type channel devices and/or p-type dopants for n-type channel devices. The channel 20 may be doped with a blanket implant. The implant dose of boron ($BF_2$) may be between $5 \times 10^{12}$ and $1 \times 10^{13}$ atoms/cm$^2$ at 100–140 keV while the implant dose indium (In) may be between $5 \times 10^{12}$ and $1 \times 10^{13}$ atoms/cm$^2$ at 200–250 keV.

The channel 20 may be doped during the manufacturing of the gate device in a process more fully described below. The source and drain 22 implants will form a heavily retrograded channel with peak concentration around the silicon-buried oxide interface. The concentration under the gate dielectric on the other hand will be much lower, which will improve carrier mobility. A heavier p-type dopant below the nitride tunneling barriers will prevent any deep punch-through. An exemplary range of concentration of these dopants is between $5 \times 10^{16}$ and $5 \times 10^8$ atoms/cm$^3$.

A gate dielectric 32 is interposed between the lower surface 34 of a gate electrode 36 and an upper surface 38 of a portion of the active region 18 of the SOI semiconductor substrate 40. The gate dielectric 32 illustrated in FIG. 1 is a single layer dielectric, however the gate dielectric could be a multi-layer dielectric. For example in a multi-layer embodiment, the gate dielectric 32 could include a thin lower dielectric layer and a thin upper dielectric layer. The gate dielectric 32 may be made of suitable gate dielectric materials, such as silicon dioxide ($SiO_2$), silicon nitride ($Si_3N_4$), or silicon oxynitride (SiON). In this embodiment, dielectric layer 32 is made of $Si_3N_4$. In the exemplary multi-layer embodiment, the thin lower dielectric layer could be made of $SiO_2$ and the thin upper dielectric layer could be made of $Si_3N_4$. The exemplary dielectric layer 32 of $Si_3N_4$ may have a thickness of between 13 and 16 Å. In the exemplary multilayer embodiment the thin lower dielectric layer of $SiO_2$ could have a thickness of between 5 and 6 Å whereas the thin upper dielectric layer of $Si_3N_4$ could have a thickness of between 8 and 10 Å. The gate electrode 36 may be made of typical, well-known gate electrode materials, for example polysilicon. An exemplary gate electrode 36 may have a thickness of between 800 and 1200 Å.

Thin nitride layers 42, 44 are interposed between a portion of the channel 20 and the two N+ regions 22. The thin nitride layers 42, 44 are illustrated in the figures with a short vertical portion and a longer horizontal portion forming a lying-L-shape. The lying-L-shaped thin nitride layers 42, 44 partially separate the respective extension regions 28 and 30 of the two N+ regions 22 from the respective deep implant regions 24 and 26. The lying-L-shaped thin nitride layers 42, 44 may be made of typical, well-known nitrides, such as silicon nitride ($Si_3N_4$), or silicon oxynitride (SiNO). In an exemplary embodiment, the thin nitride layers 42, 44 are of $Si_3N_4$ and could have a thickness of between 10–20 Å. On top of the gate electrode 36 is a dielectric layer 46. The dielectric layer 46 may be made of the same suitable gate dielectric materials described above. The dielectric layer 46 may be made of the same material as the dielectric layer 32 or may be made of another dielectric material described above. An exemplary dielectric layer 46 may have a thickness of between 50 and 100 Å. In an exemplary embodiment, the dielectric layer 46 should be nitride. The nitride dielectric layer 46 has to prevent oxidation during the oxidation step. Additionally, the nitride dielectric layer 46 may serve as a masking layer during the silicon etch and protects the polysilicon during the selective epitaxial (EPI) growth. The nitride dielectric layer 46 should have a thickness with enough margin to fulfill all three requirements. The dielectric layer 46 is removed before the gate contact is made.

A liner oxide layer 50 extends upward from the upper surface 52 of the dielectric layer 32 and covers the sidewalls of the gate electrode 36 and the dielectric layer 46. The liner oxide layer 50 may be made of typical, well-known oxide materials, for example SiO2. An exemplary liner oxide layer 50 may have a thickness of about 100 Å.

The thin nitride layers 42, 44 are a diffusion barrier and aid in the creation of the extension regions 28 and 30. Thus, an active region 18 is formed wherein thin nitride layers 42, 44 are interposed between a portion of the channel 20 in the identically doped source and drain regions 22. Thereby, the thin nitride layers 42, 44 form tunneling barriers in which electrons may tunnel from the source 22 through, the nitride layer 42 into the channel 20, traverse the channel 20 and then tunnel through nitride layer 44 into the drain 22.

It will be appreciated that the active region 18, the channel 20, the source and the drain 22, the gate dielectric 32, the gate electrode 36, the dielectric layer 46, and the thin nitride layers 42, 44, together form the SOI TJT device of the present invention. The principles of operation of an SOI TJT for inducing a conduction path (tunneling junction) between source regions and drain regions of the gate device are well known. It will be appreciated that the SOI TJT device 10 may alternatively have other shapes than the shape shown in FIG. 1.

Spacers 54 extend upward from the upper surface 52 of the gate dielectric 32 on either side of the liner oxide layer 50. The spacers 54 may be made of typical, well-known nitrides, such as silicon nitride ($Si_3N_4$), or silicon oxynitride (SiNO). Exemplary spacers 54 may have a height of between 830 and 1250 Å. Although the TJT device 10 is illustrated as a transistor on a semiconductor-on-insulator (SOI) structure, other TJT devices SRAM cells on other types of SOI substrates such as germanium-on-insulator, can also be improved using the TJT device 10 described herein.

The steps of a method 210 for fabricating a semiconductor device 310 (which may be similar to the semiconductor device 10 described above) are outlined in the flow chart shown in FIG. 2. FIGS. 3A–3F illustrate various steps of the method 210. It will be appreciated that the method 210 and the semiconductor device 310 described below are merely exemplary, and that suitable embodiments of the many above-described variations in materials, thicknesses, and/or structures may alternatively be used in the method 210 and/or the semiconductor device 310.

Figure 3A:
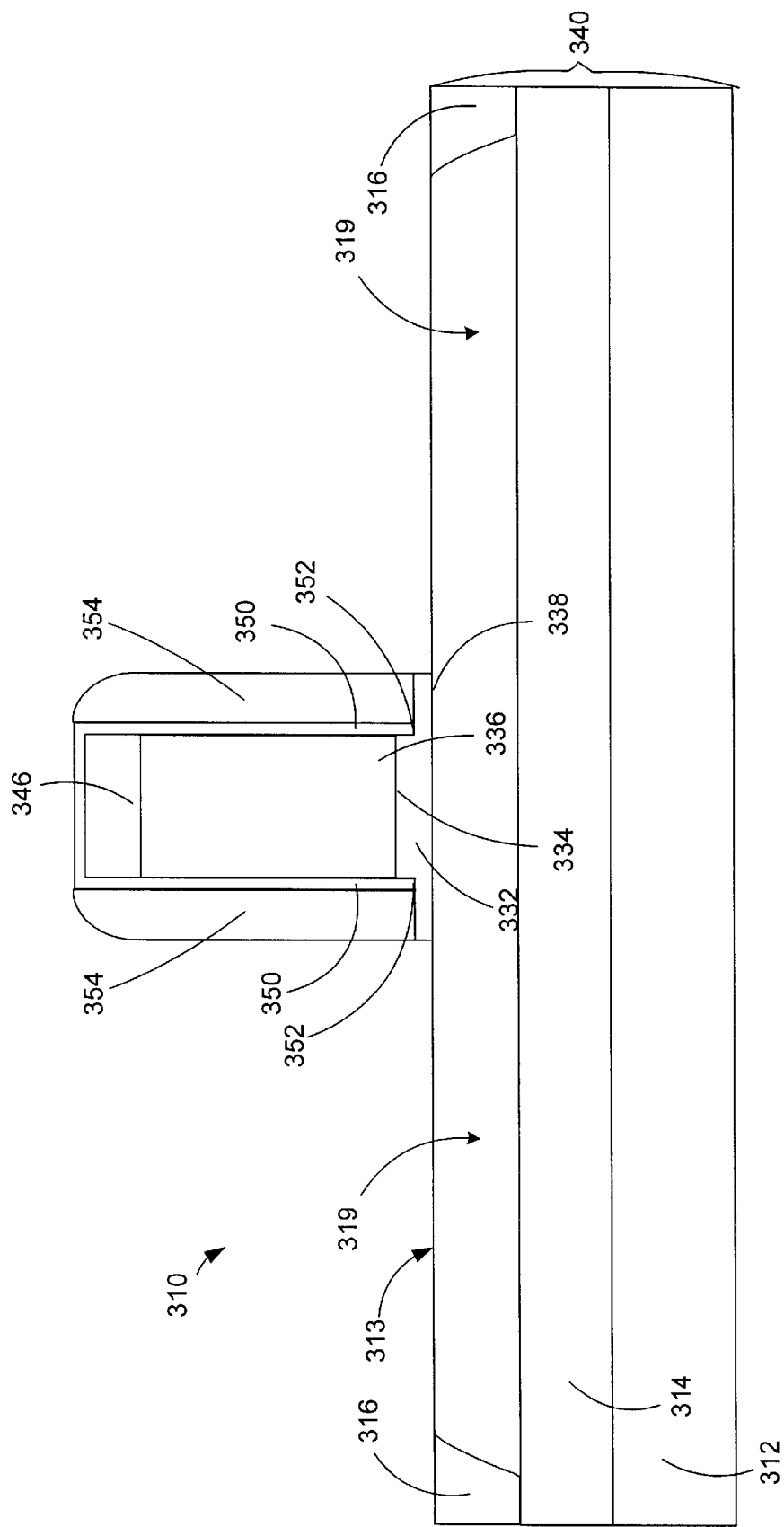
FIG. 3A is a cross-section of the SOI TJT device according to the present invention in a first intermediate stage of manufacture.

In step 212 of the method 210, a conventional nitride topped polysilicon gate with a liner oxide layer ($SiO_2$) covering the gate and nitride spacers is formed on an SOI substrate as an intermediate stage of manufacture for the SOI TJT device 310. As shown in FIG. 3A, the SOI TJT device 310 includes a semiconductor substrate 312, a BOX layer 314 formed on the semiconductor substrate 312 and a semiconductor layer 313 disposed on the BOX layer 314.

An exemplary BOX layer may have a thickness of between 1800 and 2200 Å. Whereas, an exemplary semiconductor layer 313 disposed on the BOX layer 314 may have a thickness of between 800 and 1000 Å. Suitable semiconductor materials such as silicon or germanium may be used as the semiconductor layer 313 disposed on the BOX layer 314. Within the semiconductor layer 313 disposed on the BOX layer 314, shallow trench isolation (STI) regions 316 define the location of a semiconductor active region for a future step. The STI regions 316 are insulator-filled to electrically isolate individual electrical devices such as the SOI TJT device 310. Other isolation techniques that are known in the art may be used to isolate the SOI TJT device 310.

A gate dielectric 332 is interposed between the lower surface 334 of a gate electrode 336 and an upper surface 338 of a portion of the SOI semiconductor substrate 340. The gate dielectric 332 illustrated in FIG. 3A is a single-layer dielectric, however the gate dielectric could be a multi-layer dielectric as described above. The gate dielectric 332 may be made of suitable gate dielectric materials, such as silicon dioxide ($SiO_2$), silicon nitride ($Si_3N_4$), or silicon oxynitride (SiNO). In this embodiment, dielectric layer 332 is made of $Si_3N_4$. The exemplary dielectric layer 332 of $Si_3N_4$ may have a thickness of between 13 and 16 Å. The gate electrode 336 may be made of typical, well-known conductive materials, for example polysilicon. An exemplary gate electrode 336 may have a thickness of between 800 and 1200 Å.

On top of the gate electrode 336 is a dielectric layer 346. An exemplary dielectric layer 346 may have a thickness of between 50 and 100 Å.

A liner oxide layer 350 extends upward from the upper surface 352 of the dielectric layer 332 and covers the sidewalls of the gate electrode 336 and the dielectric layer 346. The liner oxide layer 350 may be made of silicon dioxide ($SiO_2$) or any of a variety of suitable materials for use in a later step to protect portions of the gate electrode 336 from an etchant. It will be understood that the use of the term oxide with regard to the oxide layer 350 or portions thereof, encompasses the variety of suitable well-known materials for protecting the gate electrode 336. An exemplary oxide layer 350 may have a thickness of about 100 Å.

Spacers 354 extend upward from the upper surface 352 of the gate dielectric 332 on either side of the liner oxide layer 350. Exemplary spacers 354 may have a height of between 830 and 1250 Å. The nitride spacers 354 may be made of typical, well-known nitrides, for example silicon nitride ($Si_3N_4$), or silicon oxynitride (SiON). An exemplary nitride spacer 354 may have a thickness between 10–200 Å.

It will be appreciated that well-known methods may be used to form the intermediate device shown in FIG. 3A. It will further be appreciated that the insulator-filled isolation trenches 316 may be formed in a later step in the method, rather than being formed as part of the intermediate device shown in FIG. 3A.

The semiconductor substrate 340 may be appropriately doped prior to gate formation to form a region or layer of electrically-active material for eventual use as an active region of the SOI TJT device 310 to be formed. For instance, boron or indium may be implanted to form a p-type region or channel for an n-type device and phosphorous or arsenic may be implanted to form an n-type region or channel for a p-type device.

Figure 3B:
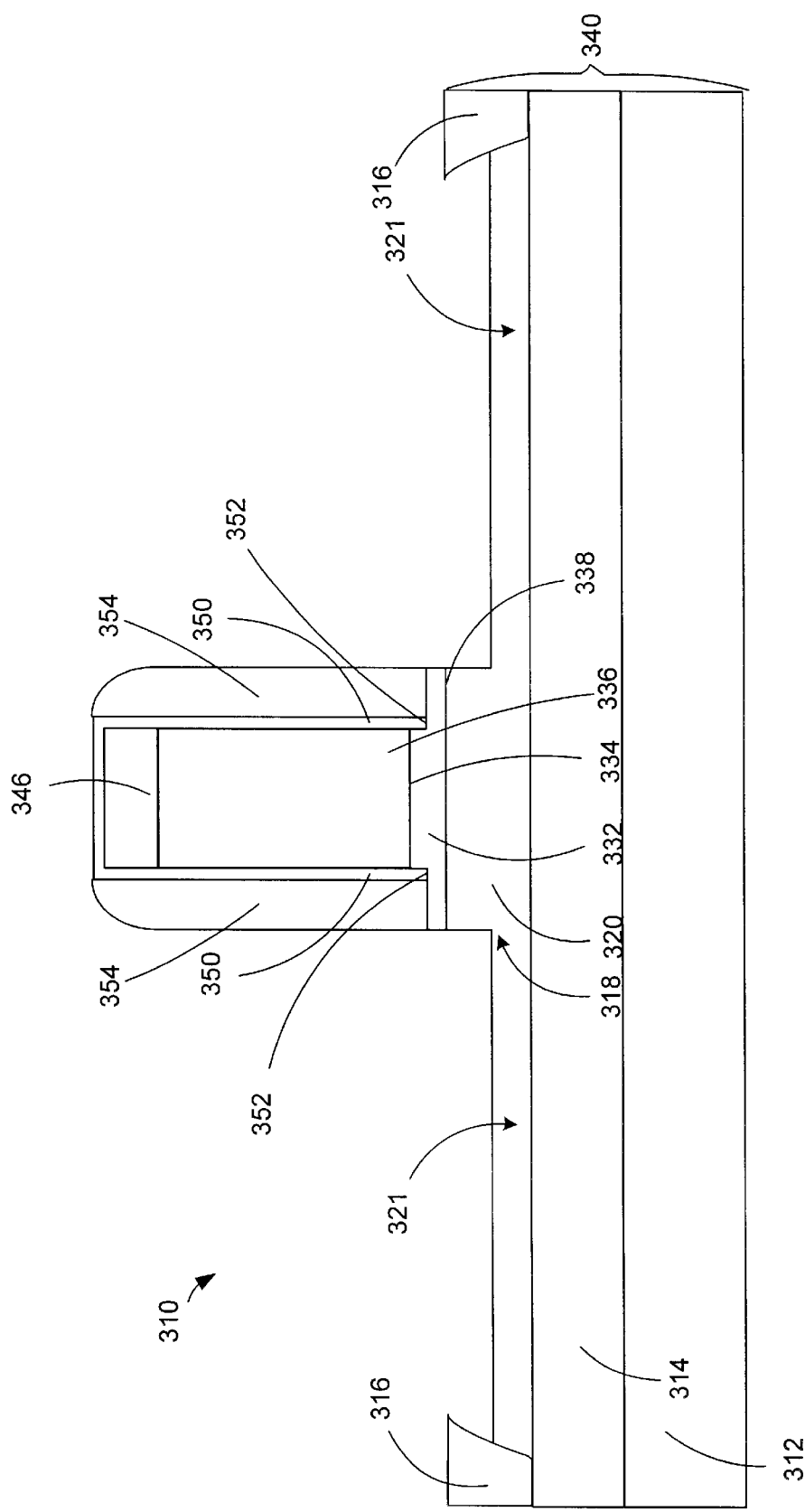
FIG. 3B is a cross-section of the SOI TJT device according to the present invention in a second intermediate stage of manufacture.
Figure 3C:
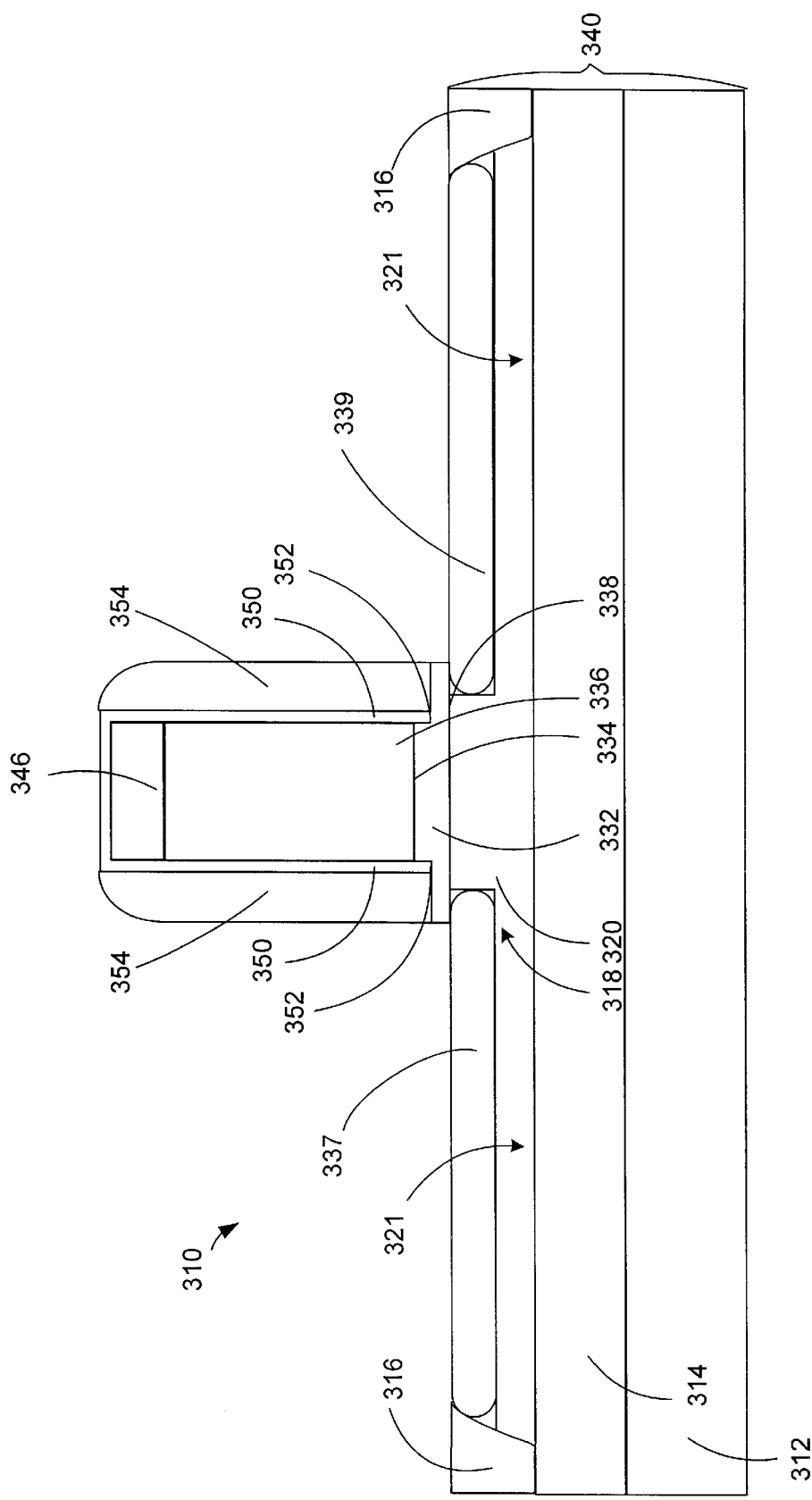
FIG. 3C is a cross-section of the SOI TJT device according to the present invention in a third intermediate stage of manufacture.

In step 216 of the method 210, an etch is performed on the exposed surface of the SOI substrate 340 between the STI regions 316. Thus layers of semiconductor material between 100 and 200 Å thick are removed, thereby leaving a new upper surface of a damaged semiconductor material exposed. It will be appreciated that suitable selective etching methods are well-known in the art. The resulting structure is illustrated in FIG. 3B. Next, an oxidation process is performed on the exposed damaged semiconductor layer. An oxidation layer of between 100 and 200 Å is formed, as illustrated in FIG. 3C. The oxidation layer is subsequently removed using methods well known in the art, which remove the oxide layer while leaving the upper surface of the etched semiconductor 321 repaired. The oxidation process repairs the upper surface of the etched semiconductor 321 for future processing of thin nitride layers.

Thereafter, in step 220, the upper surface of the etched semiconductor 321 is nitridized. The nitridation can be done for example in NH3 at 900° C. for 2 to 3 minutes. The nitridation forms thin nitride layers 341, 343 on upper surface of the etched semiconductor 321, as illustrated in FIG. 3D. Depositing nitride using conventional RTA techniques may also form the thin nitride layers 341, 343.

Figure 3E:
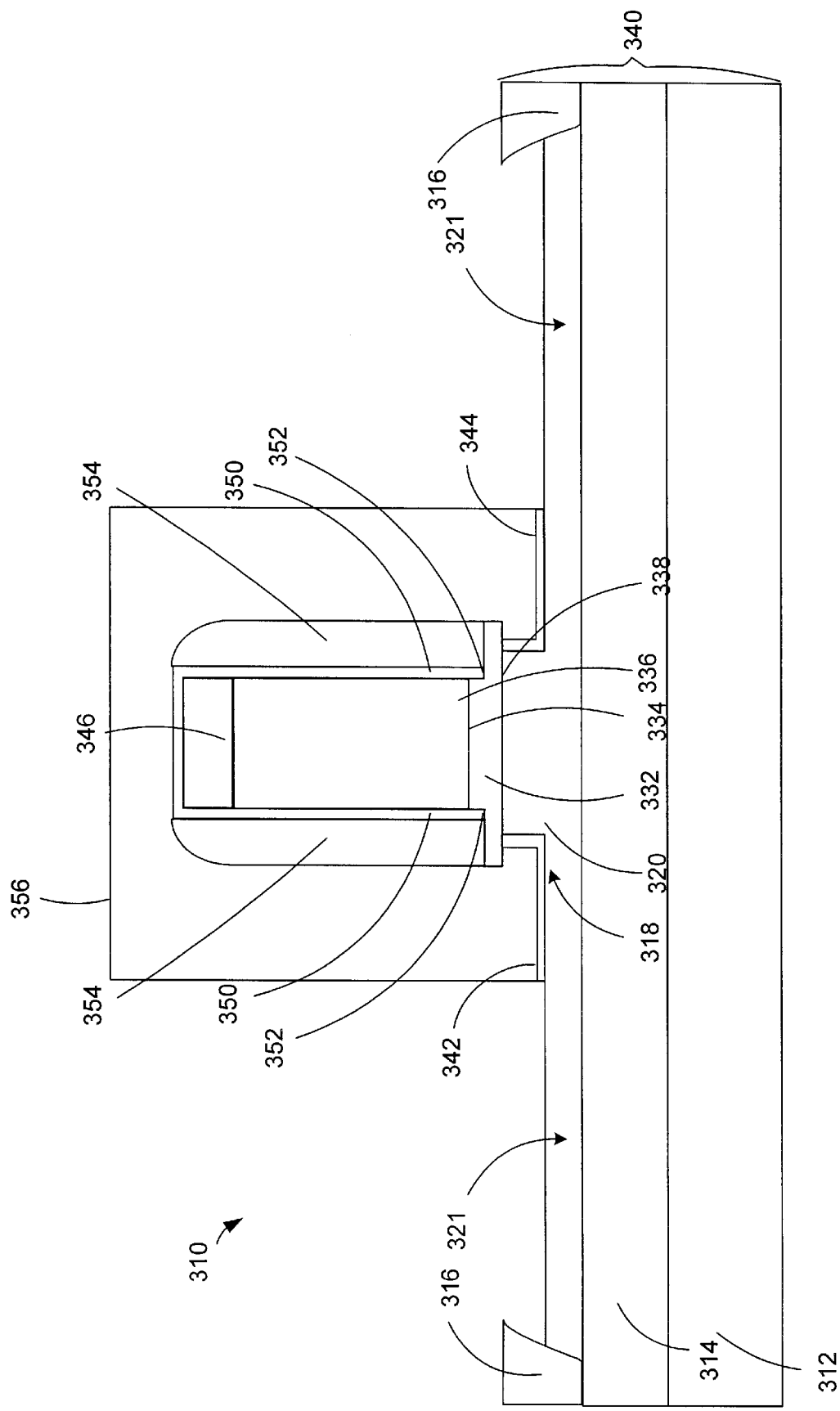
FIG. 3E is a cross-section of the SOI TJT device according to the present invention in a fifth intermediate stage of manufacture.

Next in step 228, a mask is deposited over the gate and a portion of the thin nitride layers 341, 343. Next, the exposed thin nitride layers 341, 343 are removed using well-known conventional techniques such as etching leaving lying-L-shaped thin nitride layers 342, 344. The mask covering a portion of the thin nitride layers 341, 343 prevents the etchant from removing the thin nitride layers 342, 344 protected by the mask. The mask covering the gate and the thin nitride layers 342, 344 is illustrated in FIG. 3E.

Thereafter, in step 232, silicon layers 323 are selectively grown using well-known conventional techniques over the upper surface of the etched semiconductor 321 and the thin nitride layers 342, 344. The selectively grown silicon layers 323 are between 400 and 500 Å thick. The resulting structure is illustrated in FIG. 3F.

Next, in step 236, an implantation step may be done at this time to implant arsenic or phosphorus to form the source and the drain regions. The resulting structure is illustrated in FIG. 1.

The implanting of regions of the semiconductor substrate 40, which may be performed after the gate formation, is described below. The implants produce source and drain regions, two N+ regions 22 in the substrate 40. A p-type doped channel region 20 underneath the gate dielectric 32, between the source and the drain 22 may be doped prior to the gate formation as described above.

The source and drain regions include the respective deep implant regions 24 and 26, as well as respective extension regions 28 and 30. The thin nitride layers 42, 44 are diffusion barriers and aid in the creation of the extension regions 28 and 30. Thus, an active region 18 is formed wherein thin nitride layers 42, 44 are interposed between a portion of the channel 20 in the identically doped source and drain regions 22. Thereby, the thin nitride layers 42, 44 form tunneling barriers in which electrons may tunnel from the source 22 through the nitride layer 42 into the channel 20, traverse the channel 20 and then tunnel through nitride layer 44 into the drain 22.

The source and drain regions may be formed by a combination of implants, such as main perpendicular implants and extension perpendicular implants as described below.

Now, the main source and drain regions may be formed by a main perpendicular implant, which will not affect the extension implant due to the thin nitride layers 42, 44 acting as masks. The main perpendicular implant is a relatively high energy, high concentration implant which is capable of producing the source and drain deep implant regions 24 and 26. An exemplary range of implant doses for the perpendicular implant is between $2\times10^{15}$ and $4\times10^{15}$ atoms/cm$^2$.

Although the main implantations are illustrated as each involving one implant, it will be appreciated that a greater number of implants may be employed.

It will be appreciated that many alternative sequences or steps may be used to accomplish the implantation. For example, the main implants may be performed after the formation of the thin nitride layers 42, 44 upon the SOI substrate 40 by conventional, well-known methods and means. For example, the device is doped using standard NMOS source/drain implants, such as on the order of $1\times10^{19}$ to $5\times10^{19}$ atoms per cubic centimeter, thereby forming the deep regions of source and drain, which are two N+ regions 22.

Then, the silicon layers 323 are selectively grown as described above and cover the exposed semiconductor material as well as the thin nitride layers 42, 44. The thin nitride layers 42, 44 act as masks as described above and prevent the implants from extending completely underneath the thin nitride layers 42, 44.

After implantation, the semiconductor device 10 is subjected to rapid thermal annealing (RTA). Exemplary RTA may be performed for between ten and twenty seconds at a temperature of 1,020–1,050° C.

Figure 4:
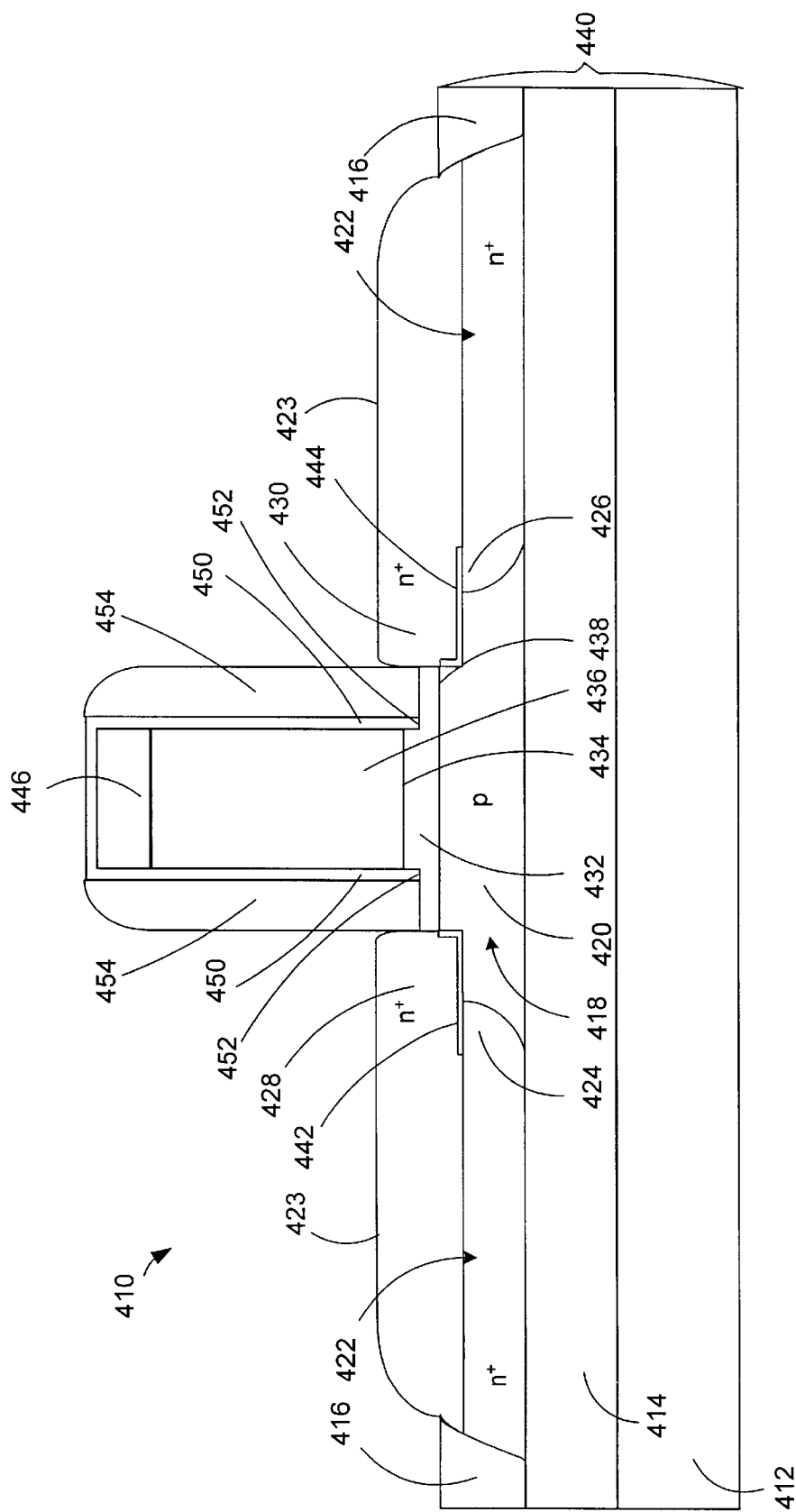
FIG. 4 is a cross-section of a second embodiment of an SOI TJT device according to the present invention.
Figure 5:
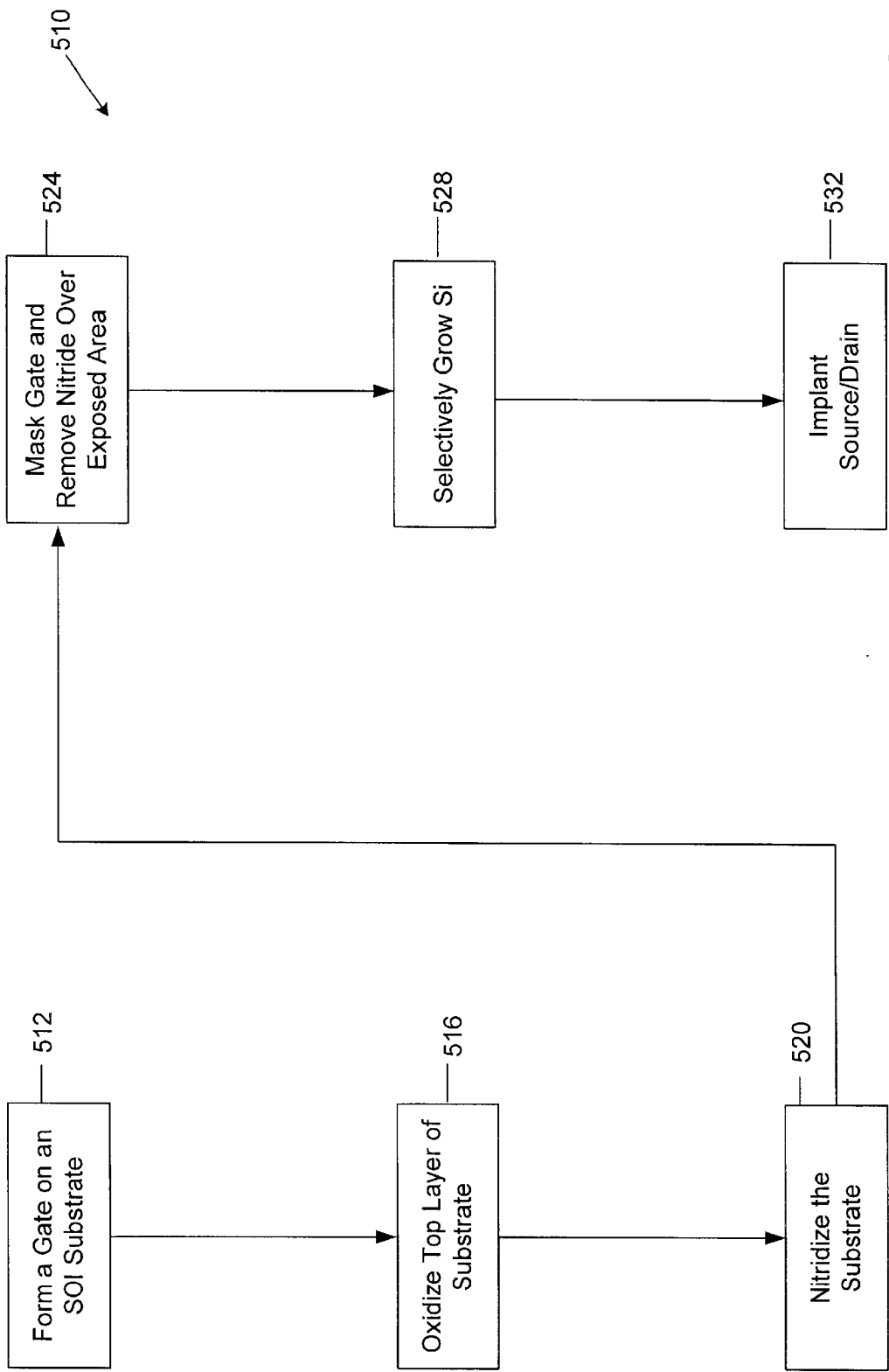
FIG. 5 is a flow diagram of a second method of manufacturing the SOI TJT device according to the present invention.

Referring now to FIG. 4, a second embodiment of a SOI TJT device 410 is described. In this embodiment, the SOI TJT device 410 includes a semiconductor substrate 412, a BOX layer 414 formed on the semiconductor substrate 412 and a semiconductor layer 413 disposed on the BOX layer 414. An exemplary BOX layer may have a thickness of between 1800 and 2200 Å. Whereas, an exemplary semiconductor layer 413 disposed on the BOX layer 414 may have a thickness of between 800 and 1000 Å. Suitable semiconductor materials such as silicon or germanium may be used as the semiconductor layer 413 disposed on the BOX layer 414. Within the semiconductor layer 413 disposed on the BOX layer 414, shallow trench isolation (STI) regions 416 define the placement of a semiconductor active region 418. The STI regions 416 are insulator-filled to electrically isolate individual electrical devices such as the SOI TJT device 410. Other isolation techniques that are known in the art may be used to isolate the SOI TJT device 410.

In an exemplary embodiment, as illustrated in FIG. 4, the active region 418 has a p-type doped region, or channel 420, and identically doped source and drain regions, N+ regions 422. The channel 420 is interposed between the two N+ regions 422. Alternatively, an n-type channel could be interposed between two P+ regions. The two N+ regions 422 have respective deep implant regions 424 and 426, as well as respective extension regions 428 and 430. The channel 420 may be predoped prior to the manufacturing of the nitride topped gate device with n-type dopants for p-type channel devices and/or p-type dopants for n-type channel devices as described above. The source and the drain 422 may be doped during the manufacturing of the nitride topped gate device in the process described above. An exemplary implant dose is between $1\times10^{14}$ and $5\times10^{14}$ atoms/cm$^2$.

A gate dielectric 432 is interposed between the lower surface 434 of a gate electrode 436 and an upper surface 438 of a portion of the active region 418 of the SOI semiconductor substrate 440. The gate dielectric 432 illustrated in FIG. 4 is a single-layer dielectric, however the gate dielectric could be a multi-layer dielectric as described above. In this embodiment, the gate dielectric layer 432 is made of $Si_3N_4$. The exemplary gate dielectric layer 432 of $Si_3N_4$ may have a thickness of between 10 and 20 Å. The gate electrode 436 may be made of typical, well-known conductive materials, for example polysilicon. The exemplary gate electrode 436 may have a thickness of between 800 and 1200 Å.

Thin horizontal nitride layers 442, 444 are interposed between a portion of the channel 420 and the two N+ regions 422. The thin horizontal nitride layers 442, 444 partially separate the respective regions 428 and 430 of the two N+ regions 422 from the respective deep implant regions 424 and 426. The thin nitride layers 442, 444 may be made of typical, well-known nitrides, such as silicon nitride ($Si_3N_4$), or silicon oxynitride (SiNO). In an exemplary embodiment, the thin nitride layers 442, 444 are of $Si_3N_4$ and could have a thickness of between 10–200 Å.

On top of the gate electrode 436 is a dielectric layer 446. The dielectric layer 446 may be made of the same suitable gate dielectric materials described above. The dielectric layer 446 may be made of the same material as the dielectric layer 432 or may be made of another dielectric material described above. An exemplary dielectric layer 446 may have a thickness of between 50 and 100 Å.

A liner oxide layer 450 extends upward from the upper surface 452 of the dielectric layer 432 and covers the sidewalls of the gate electrode 436 and the dielectric layer 446. The liner oxide layer 450 may be made of silicon dioxide ($SiO_2$) or any of a variety of suitable materials for use in a later step to protect portions of the gate electrode 436 from an etchant. It will be understood that the use of the term oxide with regard to the oxide layer 450 or portions thereof, encompasses the variety of suitable well-known materials for protecting the gate electrode 436. An exemplary oxide layer 450 may have a thickness of about 100 Å.

Spacers 454 extend upward from the upper surface 452 of the gate dielectric 432 on either side of the liner oxide layer 450. Exemplary spacers 454 may have a height of between 830 and 1250 Å. The nitride spacers 454 may be made of typical, well-known nitrides, for example silicon nitride ($Si_3N_4$), or silicon oxynitride (SiON). An exemplary nitride spacer 454 may have a thickness of between 100–200 Å.

Figure 6A:
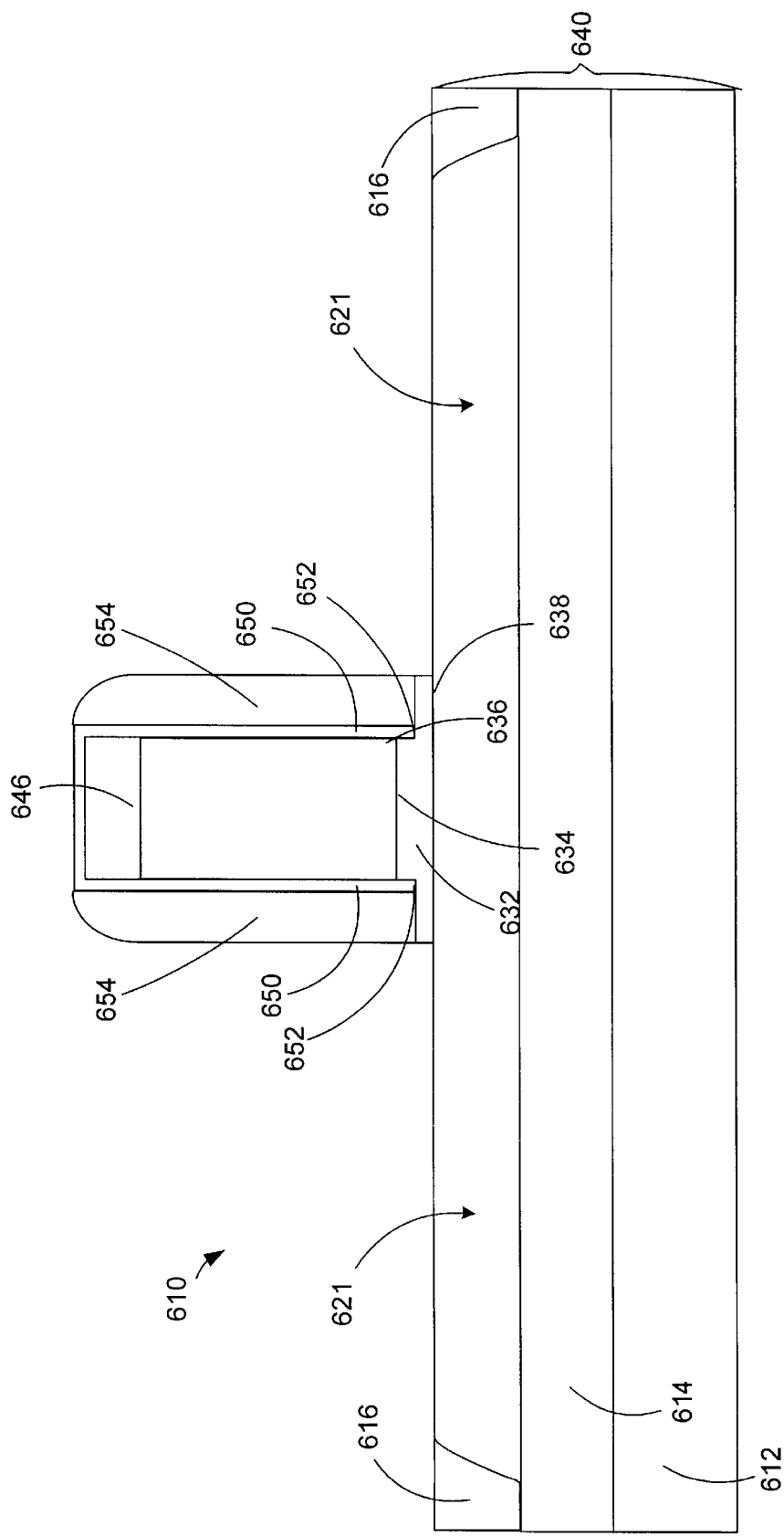
FIG. 6A is a cross-section of the SOI TJT device according to the present invention in a first intermediate stage of manufacture.

The steps of a method 510 for fabricating a semiconductor device 610 begins with step 512 involved with manufacturing the intermediate semiconductor device 610 as illustrated in FIGS. 6A. It will be appreciated that the method and the semiconductor device 610 described below are merely exemplary, and that suitable embodiments of the many above-described variations in materials, thicknesses, and/or structures may alternatively be used in the method and/or the semiconductor device 610.

As shown in FIG. 6A, the SOI TJT device 610 includes a semiconductor substrate 612, a BOX layer 614 formed on the semiconductor substrate 612 and a semiconductor layer 621 disposed on the BOX layer 614. An exemplary BOX layer may have a thickness of between 1800 and 2200 Å. Whereas, an exemplary semiconductor layer 621 disposed on the BOX layer 614 may have a thickness of between 800 and 1000 Å. Suitable semiconductor materials such as silicon or germanium may be used as the semiconductor layer 621 disposed on the BOX layer 614. Within the semiconductor layer 621 disposed on the BOX layer 614, shallow trench isolation (STI) regions 616 define the location of a semiconductor active region for a future step. The STI regions 616 are insulator-filled to electrically isolate individual electrical devices such as the SOI TJT device 610. Other isolation techniques that are known in the art may be used to isolate the SOI TJT device 610.

A gate dielectric 632 is interposed between the lower surface 634 of a gate electrode 636 and an upper surface 638 of a portion of the SOI semiconductor substrate 640. The gate dielectric 632 illustrated in FIG. 6A is a single-layer dielectric, however the gate dielectric could be a multi-layer dielectric as described above. The gate dielectric 632 may be made of suitable gate dielectric materials, such as silicon dioxide ($SiO_2$), silicon nitride ($Si_3N_4$), or silicon oxynitride (SiNO). In this embodiment, dielectric layer 632 is made of $Si_3N_4$. The exemplary dielectric layer 632 of $Si_3N_4$ may have a thickness of between 10 and 20 Å. The gate electrode 636 may be made of typical, well-known conductive materials, for example polysilicon. An exemplary gate electrode 636 may have a thickness of between 800 and 1200 Å.

On top of the gate electrode 636 is a dielectric layer 646. An exemplary dielectric layer 646 may have a thickness of between 100 and 200 Å.

A liner oxide layer 650 extends upward from the upper surface 652 of the dielectric layer 632 and covers the sidewalls of the gate electrode 636 and the dielectric layer 646. The liner oxide layer 650 may be made of silicon dioxide ($SiO_2$) or any of a variety of suitable materials for use in a later step to protect portions of the gate electrode 636 from an etchant. It will be understood that the use of the term oxide with regard to the oxide layer 650 or portions thereof, encompasses the variety of suitable well-known materials for protecting the gate electrode 636. An exemplary oxide layer 650 may have a thickness of about 100 Å.

Spacers 654 extend upward from the upper surface 652 of the gate dielectric 632 on either side of the liner oxide layer 650. Exemplary spacers 654 may have a height of between 830 and 1250 Å. The nitride spacers 654 may be made of typical, well-known nitrides, for example silicon nitride ($Si_3N_4$), or silicon oxynitride (SiON). An exemplary nitride spacer 654 may have a thickness between 10–20 Å.

It will be appreciated that well-known methods may be used to form the intermediate device shown in FIG. 6A. It will further be appreciated that the insulator-filled isolation trenches 616 may be formed in a later step in the method, rather than being formed as part of the intermediate device shown in FIG. 6A.

The semiconductor substrate 640 may be appropriately doped prior to gate formation to form a region or layer of electrically-active material for eventual use as an active region of the SOI TJT device 610 to be formed. For instance, boron or indium may be implanted to form a p-type region or channel for an n-type device and phosphorous or arsenic may be implanted to form an n-type region or channel for a p-type device.

Figure 6B:
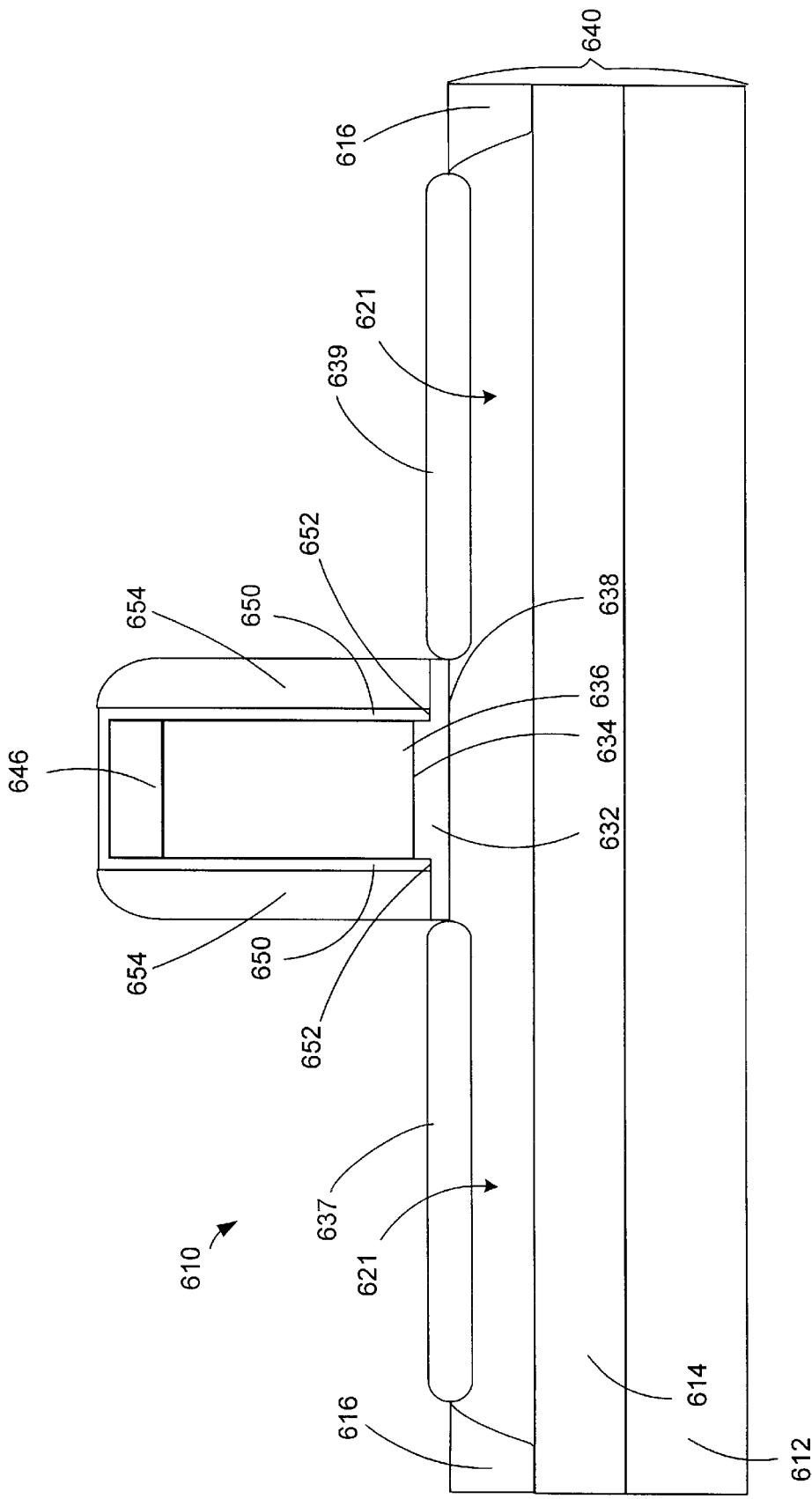
FIG. 6B is a cross-section of the SOI TJT device according to the present invention in a second intermediate stage of manufacture.
Figure 6C:
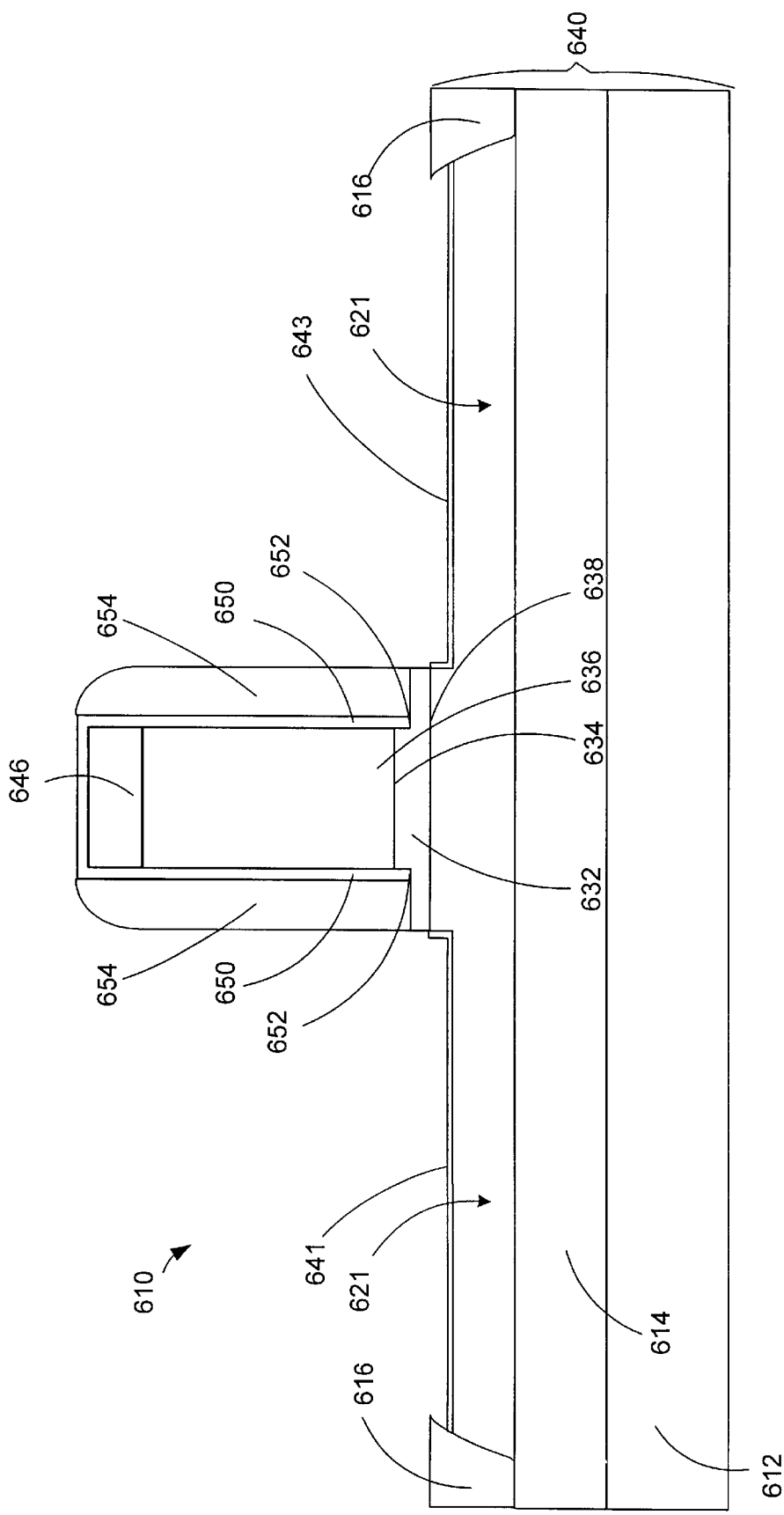
FIG. 6C is a cross-section of the SOI TJT device according to the present invention in a third intermediate stage of manufacture.

In step 516, after the formation on an SOI structure of a conventional nitride topped polysilicon gate with a liner oxide layer ($SiO_2$) covering the gate and nitride spacers are formed, an oxidation process is performed on the exposed semiconductor layer 621, as illustrated in FIG. 6B. An oxidation layer 637, 639 of between 300 and 400 Å is formed. The oxidation layer 637, 639 is subsequently removed using methods well known in the art Thereafter, in step 520, the upper surface of the semiconductor 638 is nitridized. The nitridation can be done for example in NH3 at 900° C. for 2 to 3 minutes. The nitridation forms thin nitride layers 641, 643 on the upper surface of the semiconductor 638, as illustrated in FIG. 6C. Depositing nitride using conventional RTA techniques may also form the thin nitride layers 641, 643.

Figure 6D:
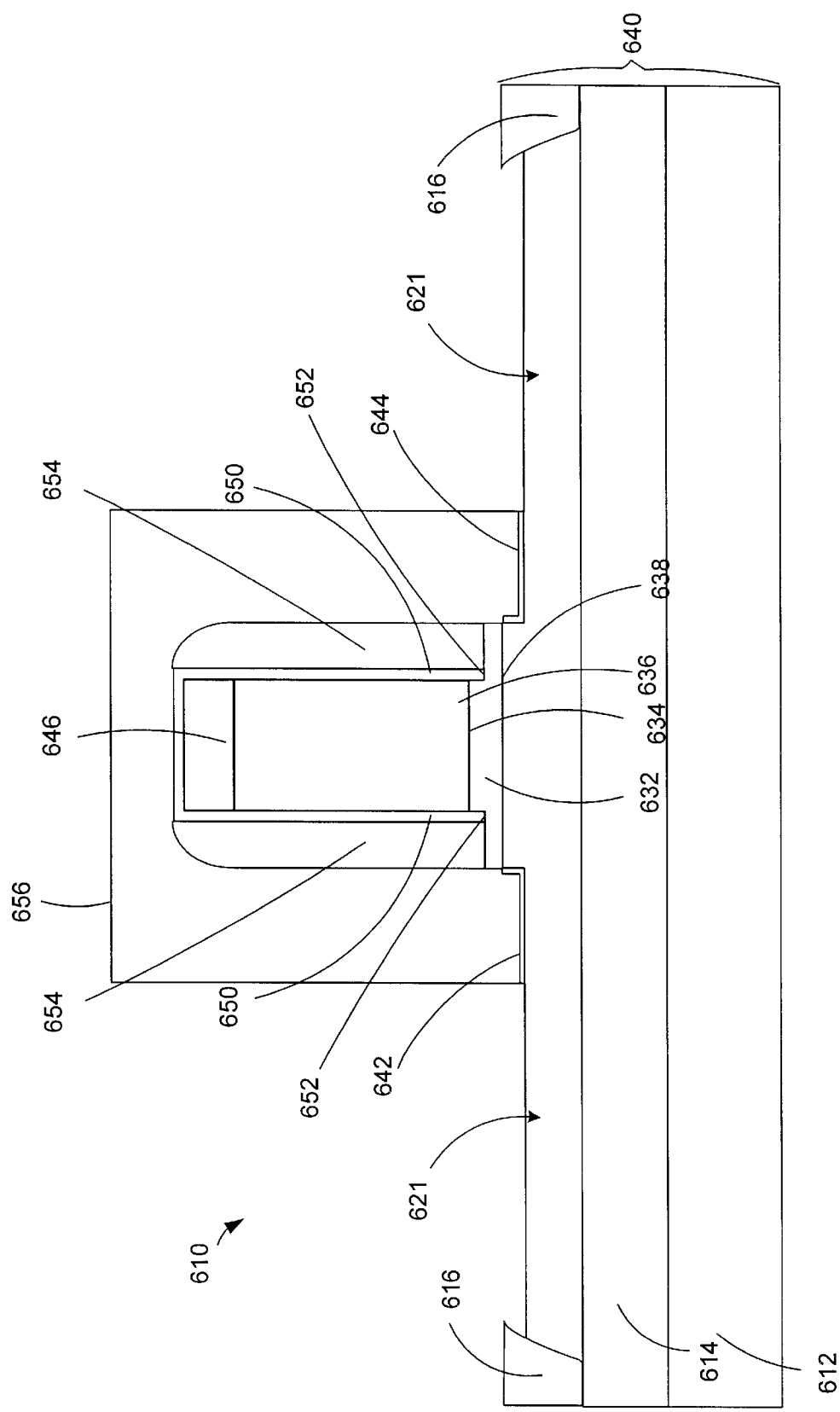
FIG. 6D is a cross-section of the SOI TJT device according to the present invention in a fourth intermediate stage of manufacture.

Next in step 524, a mask 656 is deposited over the gate and a portion of the thin nitride layers 641, 643. Next, the exposed thin nitride layers 641, 643 are removed using well-known conventional techniques such as etching leaving thin nitride layers 642, 644. The mask covering a portion of the thin nitride layers 641, 643 prevents the etchant from removing the thin nitride layers 642, 644 protected by the mask. The mask covering the gate and the thin nitride layers 642, 644 is illustrated in FIG. 6D.

Figure 6E:
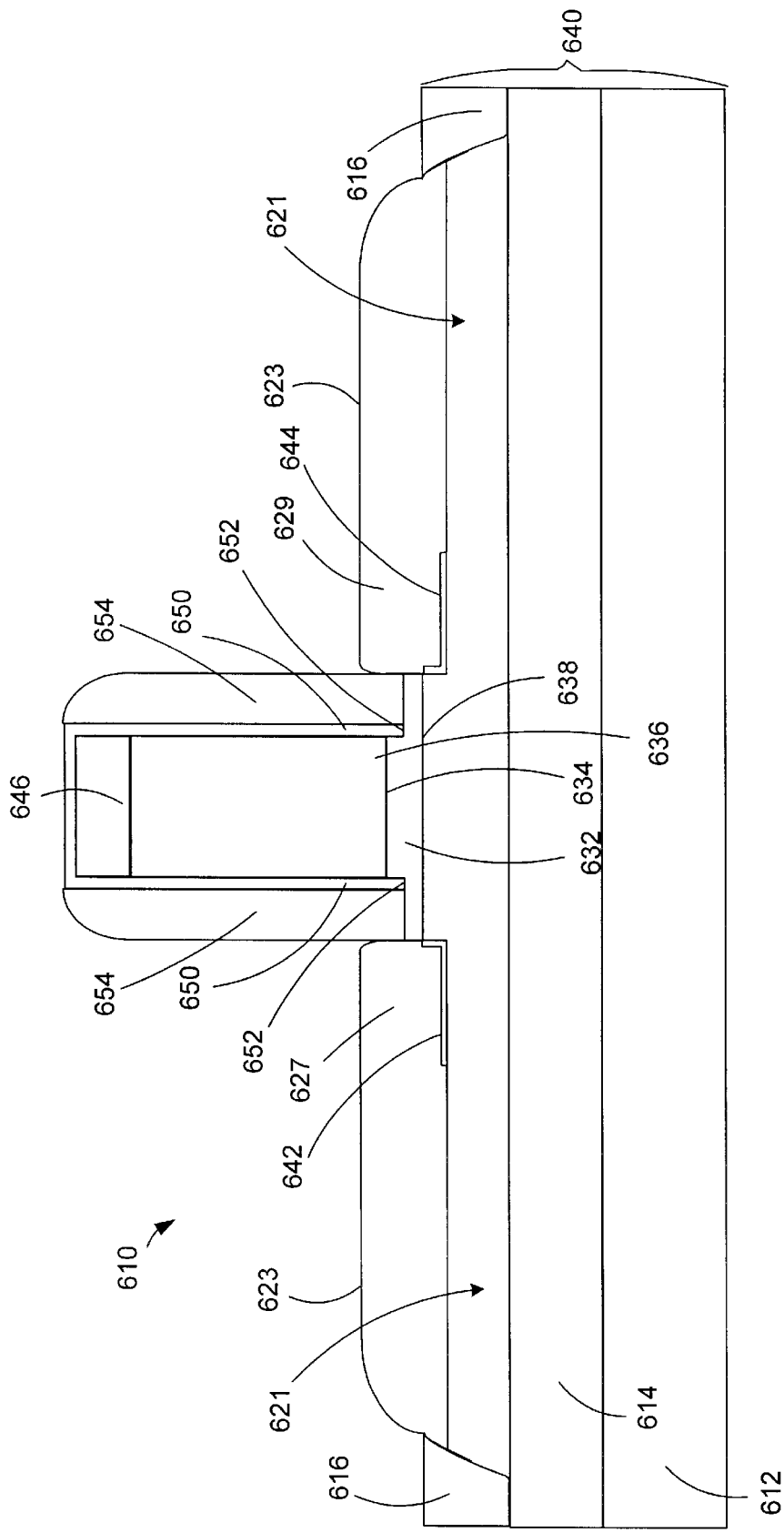
FIG. 6E is a cross-section of the SOI TJT device according to the present invention in a fifth intermediate stage of manufacture.

Thereafter, in step 528, silicon layers 623 are selectively grown using well-known conventional techniques over the exposed upper surface of the semiconductor 638 and the thin nitride layers 642, 644. The selectively grown silicon layers 623 are between 200 and 400 Å thick. The resulting structure is illustrated in FIG. 6E.

Next, in step 532, an implantation step may be done at this time to implant arsenic or phosphorus to form the source and the drain regions. The resulting structure is illustrated in FIG. 4. The implanting of the source and the drain regions 622 of the semiconductor substrate 640 may be performed as described above. An exemplary range of implant doses for the perpendicular implant is between $1 \times 10^{15}$ and $2 \times 10^{15}$ atoms/cm$^2$. The thin nitride layers 642, 644 act as masks as described above and prevent the implants from extending completely underneath the thin nitride layers 642, 644.

After implantation, the semiconductor device 610 is subjected to rapid thermal annealing (RTA). Exemplary RTA may be performed for between ten and twenty seconds at a temperature of 1,020–1,050° C.

Although particular embodiments of the invention have been described in detail, it is understood that the invention is not limited correspondingly in scope, but includes all changes, modifications and equivalents coming within the spirit and terms of the claims appended hereto.

What is claimed is:

1. A tunneling junction transistor (TJT) device formed on a semiconductor-on-insulator (SOI) substrate with a buried oxide (BOX) layer disposed therein and an active layer disposed on the BOX layer having active regions defined by isolation trenches, the TJT device comprising:
    a gate defining a channel interposed between a source and a drain formed within one of the active regions of the SOI substrate, wherein the source and the drain include a source extension and a drain extension, respectively; and
    a thin nitride layer is interposed between at least a portion of the channel and at least one of the source extension and the drain extension,
    wherein the channel is a heavily retrograded channel including;
        a greater concentration of ions in a first region between a silicon-buried oxide interface of the SOI substrate and a lower surface of the thin nitride layer, the greater concentration of ions preventing deep punch-through, and
        a lower concentration of ions in a second region between a gate dielectric and the lower surface of the thin nitride layer, the lower concentration of ions improving carrier mobility.

2. A TJT device according to claim 1, wherein the thin nitride layer forms tunneling junctions between the at least a portion of the channel and at least one of the source and the drain.

3. The TJT device according to claim 1, wherein the source and the drain are identically doped.

4. The TJT device according to claim 1, wherein the source and the drain are N+ doped.

5. The TJT device according to claim 1, wherein the channel is p-type doped.

6. The TJT device according to claim 1, wherein the gate is formed before the source and the drain.

7. The TJT device according to claim 1, wherein the gate includes side wall spacers.

8. The TJT device according to claim 7, wherein the side wall spacers are of a nitride material.

9. The TJT device according to claim 1, wherein the gate includes a gate electrode.

10. The TJT device according to claim 9, wherein the gate electrode is formed of a semiconductor material.

11. The TJT device according to claim 10, wherein the gate electrode is formed of a polysilicon.

12. The TJT device according to claim 10, wherein the gate electrode of the first gate is N+ doped.

13. The TJT device according to claim 10, wherein the gate includes a first dielectric layer interposed between the electrode of the gate and the channel.

14. A tunneling Junction transistor (TJT) device formed on a semiconductor-on-insulator (SOI) substrate with a buried oxide (BOX) layer disposed therein and an active layer disposed on the BOX layer having active regions defined by isolation trenches, the TJT device comprising:
    a gate defining a channel interposed between a source and a drain formed within one of the active regions of the SOI substrate, wherein the source and the drain include a source extension and a drain extension, respectively; and
    at least one tunneling barrier Interposed between a portion of the channel and at least one of the source extension and the drain extension,
    wherein the channel is a heavily retrograded channel including;
        a greater concentration of ions in a first region between a silicon-buried oxide interface of the SOI substrate and a lower surface of the at least one tunneling barrier, the greater concentration of ions preventing deep punch-through, and
        a lower concentration of ions in a second region between a gate dielectric and the lower surface of the at least one tunneling barrier, the lower concentration of ions improving carrier mobility.

15. A tunneling junction transistor (TJT) device formed on a germanium-on-insulator (GOI) substrate with a buried oxide (BOX) layer disposed therein and an active layer disposed on the BOX layer having active regions defined by isolation trenches, the TJT device comprising:
    a gate defining a channel interposed between a source and a drain formed within one of the active regions of the GOI substrate,
    wherein a plurality of thin nitride layers are interposed between at least a portion of the channel and at least one of the source and the drain, and
    wherein the channel is a heavily retrograded channel including;
        a greater concentration of ions in a first region between a germanium-buried oxide interface of the GOI substrate and lower surfaces of the plurality of thin nitride layers, the greater concentration of ions preventing deep punch-through, and
        a lower concentration of ions in a second region between a gate dielectric and the lower surfaces of the plurality of thin nitride layers, the lower concentration of ions improving carrier mobility.

16. The TJT device according to claim 1, wherein the thin nitride layer has a vertical component and a horizontal component, wherein the vertical component and the horizontal component of the thin nitride layer have an interface with the at least one of the source extension and the drain extension.

* * * * *